United States Patent [19]

Ehrhardt et al.

[11] 4,108,737

[45] Aug. 22, 1978

[54] METHOD OF CONTINUOUS PRODUCTION OF A DUCTILE SUPERCONDUCTING MATERIAL IN THE FORM OF TAPES, FOILS OR WIRES

[75] Inventors: Josef Ehrhardt, Wiesbaden; Heinrich Winter, Eschborn, both of Germany

[73] Assignee: Battelle-Institute, Postfach, Germany

[21] Appl. No.: 782,381

[22] Filed: Mar. 29, 1977

[30] Foreign Application Priority Data

Mar. 29, 1976 [DE] Fed. Rep. of Germany ....... 2613285

[51] Int. Cl.² .................. C25D 1/04; C25D 15/00; C25D 15/02
[52] U.S. Cl. .......................... 204/13; 204/4; 204/16
[58] Field of Search ............. 204/16, 3, 4, 9, 10, 204/12, 13

[56] References Cited

U.S. PATENT DOCUMENTS

| | | | |
|---|---|---|---|
| 2,433,441 | 12/1947 | Davidoff | 204/13 |
| 3,715,285 | 2/1973 | Tsuchiya et al. | 204/16 |

FOREIGN PATENT DOCUMENTS 2,000,407  7/1971  Fed. Rep. of Germany ............ 204/16

*Primary Examiner*—T. M. Tufariello

[57] ABSTRACT

A method for the continuous production of ductile, superconducting tapes, foils, or wires disclosed in which extremely small superconducting particles are incorporated into a metallic matrix. In the method, niobium nitride particles are suspended in an electrolyte solution and are subsequently electrodeposited on an endless steel belt. The electrodeposited particles are peeled off the belt and formed into tapes, foils or wires.

20 Claims, 1 Drawing Figure

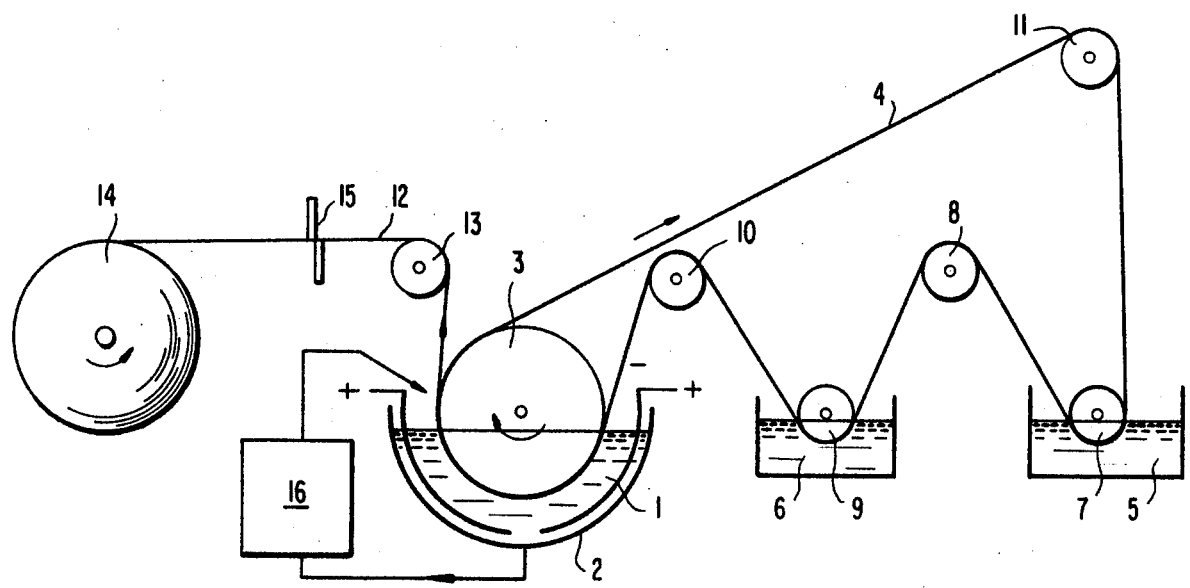

METHOD OF CONTINUOUS PRODUCTION OF A DUCTILE SUPERCONDUCTING MATERIAL IN THE FORM OF TAPES, FOILS OR WIRES

FIELD OF THE INVENTION

The invention relates to a method for the continous production of a ductile superconducting material in the form of tapes, foils or wires consisting of extremely small superconducting particles incorporated in a metallic matrix material.

DESCRIPTION OF THE PRIOR ART

The hard superconductors, which are also called superconductors of the third kind, show the highest known transition temperatures, i.e. up to above 20° K, high upper critical magnetic fields $H_{c2}$ of up to above 100 kG, and the highest known critical current densities $J_c$ of up to about $10^7$ A/cm$^2$. They are, however, very hard and brittle substances which cannot be shaped into articles of elongated form, e.g. tapes, foils or wires. The production of superconducting materials using these hard superconductors has, therefore, been effected so far by other methods, for instances, by coating niobium tapes or wires with tin or aluminium. After an annealing treatment, the surface layer was then converted into the brittle superconducting phase — in the example selected here, into Nb$_3$Sn or Nb$_3$Al. The result of these reactions was, however, always unsatisfactory, since in addition to the desired phase, e.g. Nb$_3$Al, other little or non-superconducting phases, such as NbAl$_3$, were also formed. In addition, in most cases it was not possible to produce sufficiently thick layers of the superconducting phase, because the resultant tape or wire would have been too brittle. Furthermore, the inherent stability, i.e. the resistance to flux movements, was usually unsatisfactory, unless the hard superconductors had been incorporated in a copper matrix in the form of extremely thin filaments. These so-called multifilamentary composites, however, require a very sophisticated method of production. In the production of such multifilamentary composites it is unavoidable that the copper matrix contains some unreacted metal, e.g. tin, aluminum, germanium, gallium or silicon, which is to react with the thin superconducting niobium or vanadium wires; this contamination, however, leads to an objectionable reduction of the desired electrical and thermal conductivity of the copper matrix, which results in insufficient inherent stability.

It is also known that the brittle superconducting phases are incorporated discontinuously in a pure copper matrix in order to obtain ductile superconductors with better superconducting properties. C. C. Tsuei (Science, 180 (1973) 58) was successful here by way of melting. The first to achieve this by powder metallurgy was B. L. Mordike (Z. Metallkunde, 65 (1974) 395), and by electrodeposition was Raub et al. (H. R. Khan and Ch. J. Raub, J. Less Common Metals 43 (1975) 49–54). While the transition temperatures measured according to these publications on the materials thus produced corresponded approximately to the transition temperatures of the incorporated superconducting particles, the critical current densities $J_c$ achieved were rather low; in addition, the workability decreased with increasing proportion of superconducting phase, so that it was no longer possible to produce tapes, foils or wires. It should be noted, however, that high critical current densities require high proportions of superconducting phase.

SUMMARY OF THE INVENTION

It is the object of the present invention to overcome the above described disadvantages and to find a way of producing ductile superconducting material of the above-described type, which is characterized by substantially improved superconducting and very favorable mechanical properties compared with corresponding conventional materials.

It has be come apparent that this problem can be solved in a technologically very advanced way by the method hereinafter described The method of production according to the invention is based on the finding that in the case of a very fine dispersion of superconducting particles in a metallic matrix the whole material becomes superconducting; this is known to occur already at a particle spacing within the matrix of the order of the coherence length $\xi_o$, i.e. within the region of about 1000 A. It is surprising that not only the superconducting properties, in particular the upper critical magnetic field $H_{c2}$ and the critical current density $I_c$, but also the mechanical strength of the resultant composite increases with decreasing spacing of the incorporated superconducting particles, while the ductility is hardly reduced at all. If the mean distance between the particles is reduced to about 100 A, a further increase in the upper critical magnetic field $H_{c2}$ is observed to be accompanied by an increase in the transition temperature $T_c$. In this case the superconducting properties of the composite are better than those of the incorporated superconductor in bulk form.

The incorporation of very finely dispersed superconducting particles in the copper matrix changes the thermal conductivity of the composite and its electrical conductivity above the transition temperature to a minor extent. In addition, the tensile strength values achieved at sufficient ductility may exceed 70 kg/mm$^2$.

For reasons of cost, a particularly suitable matrix metal is copper. The superconducting particles may consist of niobium nitride, niobium carbide, niobium carbonitride of the composition NbC$_{1-x}$N$_x$ with x > 0.5, or of intermetallic compounds of niobium or vanadium with the elements Al, Ge, Ga, Si and Sn which have a $\beta$W/A15 structure. The particle size ranges between 50 and 2000 A.

The method according to the invention permits the economic and continuous production of highly ductile tapes, foils or wires of high critical current density.

BRIEF DESCRIPTION OF THE FIGURE

The FIGURE shows a schematic diagram of the production method according to the invention.

DETAILED DESCRIPTION OF THE PREFERRED EMBODIMENTS

Additional features, advantages and possible applications of the invention result from the following description of further details of the method covered by the invention by example of special embodiments and from the enclosed schematic drawing of a manufacturing device. The examples cover the production of superconducting wires, and the production of superconducting tapes or foils.

To produce superconducting wires by the method according to the invention, alternating layers of a dispersion with a volume content of more than 10 percent of superconducting particles below 2000 A in diameter in the copper were continuously deposited. The thickness of the dispersion layers advantageously ranged between 5 and 50 μm, and that of the copper layers approximately between 2 and 20 μm. If a starting wire of a diameter between 100 and 1000 μm was selected, it was possible to achieve volume contents of superconducting phase of 5 percent or more in the total cross section of the resultant wire.

The deposition of intermediate layers of copper contributes essentially to the increase in ductility, so that rupture and scaling of the dispersion layer is prevented. In addition, it makes the coating smooth, which has a very favorable effect on the subsequent wire drawing process.

It was found that drawing processes and intermediate annealing treatments at about 700° C in inert gas or a reducing atmosphere did not impair the superconducting properties of the wire produced, but improved them significantly. In addition, it proved favorable to increase the diameter of the starting wire by about 50 percent by alternately depositing dispersion layers and copper layers and then to try to re-achieve the original cross section by drawing processes.

The required very small size of the superconducting particles to be incorporated in the metal matrix was not available and could not be produced by known methods such as ball milling, for example. Surprisingly it turned out that these superconducting particles between 100 and 2000 A in diameter can easily be produced by the simultaneous introduction of clorides of niobium or vanadium and carbon- or nitrogen- containing gases or gaseous compounds of aluminum, tin, gallium, germanium or silicon into an arc burning in a nitrogen atmosphere according to E. Neuenschwander (J. Less Common Metals 11 (1969) 365–375). The method by Neuenschwander can be used to produce niobium nitride particles with a mean diameter of about 100 A by blowing niobium chloride and nitrogen into a hydrogen plasma, where the following reaction takes place.

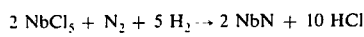

$$2\, NbCl_5 + N_2 + 5\, H_2 \rightarrow 2\, NbN + 10\, HCl$$

The particles are precipitated in the reaction zone and settle down at the bottom of the vessel, where they are collected. Analogously, particles of similar grain size can be produced from niobium carbonitride $NbC_{1-x}N_x$ ($x \geq 0.5$) with a transition temperature of 18° K.

In principle, this method can also be used to produce correspondingly fine particles from the $A_3B$ compound of niobium or vanadium with $\beta W/A15$ structure, e.g. $V_3Si$:

$$3\, VCl_5 + SiCl_4 + 9.5\, H_2 \rightarrow V_3Si + 19\, HCl$$

Particles of this superconducting compound show optimum results after incorporation in a metal matrix.

The resultant fine particles were readily suspended in the electrolyte by means of a wetting agent such as sodium dodecyl sulfonate (0.1 to 2 g/l).

In addition, it proved advantageous to reduce the wire cross section obtained by the method according to the invention to approximately its original size directly after the deposition of each pair of layers. It was possible to integrate the drawing dies into the continuous deposition process.

The characteristic features for the production of such a superconducting wire by the method covered by the invention are compiled in the following list:

Diameter of the starting wire which serves as core: 300 μm

Wire material: copper

Electrolyte: sulfuric, alkaline or cyanidic Cu baths, alternatively

Superconducting particles: NbC

Particle size: 300 A

Wetting agent: sodium dodecyl sulfonate 0.5 g/l

Thickness of the dispersion layer: 20 μm

Volume content of superconducting particles in this layer: 24 vol.%

Thickness of the intermediate copper layer: 10 μm

Total number of layers: five 20- μm layers and five 10- μm layers

Diameter of the wire after the last production step: 450 μm

Diameter of the wire after reduction by drawing: 300 μm

Final annealing treatment in a hydrogen atmosphere: 1 h at 700° C.

Transition temperature $T_c = 16.7°$ K

Critical current density, $J_c = 7 \cdot 10^5$ A/cm$^2$

Upper critical magnetic field, $H_{c2}$: 350 kG

Volume content of superconducting particles related to the total cross section: 10 vol. %.

It was also found that for a particle size of about 200 A and a volume content of $V_3Si$ of about 24 percent the transition temperature of the coated wire produced by the method according to the invention was about 23.7° K, i.e. far above the transition temperature of 18° K of the superconducting $V_3Si$ compound in bulk form. At a temperature of 4.2° K it was possible to achieve critical current densities of $3 \cdot 10^6$ A/cm$^2$, related to the total cross section of the wire. The value of the upper critical magnetic field $H_{c2}$ of 700 kG also exceeded that of the incorporated superconducting compound in bulk form substantially. With this wire it was still possible to achieve suitable superconducting properties at the temperature of boiling liquid hydrogen.

Appropriate modifications of the described method according to the invention have been used for the continuous coating of tapes and sections.

Particularly high volume contents of superconducting particles can be achieved by the method according to the invention if the coated wire reduced to its original diameter is re-introduced into the deposition process. By repeated passage through the plant the original proportion of the copper core is more and more reduced and finally can be neglected. In this way is was possible to achieve volume contents of superconducting particles above 30 percent.

Finally, it was found that at particle distances below 200 A the transition temperature in general increased strongly compared with the transition temperature of the incorporated particles. Thus it was possible to produce superconducting wires that can be cooled with liquid hydrogen.

Tapes or foils to be cut into tapes, which are produced by the method according to the invention, are required in particular for making superconducting magnet coils to produce very high magnetic fields. Their rectangular cross section permits the production of comparatively compact windings and thus results in high numbers of ampere turns. The mechanical strength is also favorably affected by the rectangular cross section.

The mechanical strength values of the windings or of the tapes of superconducting magnet coils also have to meet high requirements, because high current lead and the resultant high magnetic fields cause high so-called Lorentz forces which may lead to lasting deformation if the stress exceeds the yield point of copper. High-field superconductors suitable in practice, therefore, have to satisfy the following conditions:

Rectangular conductor cross section, tensile strength above 30 kg/mm$^2$, sufficiently high ductility, high transition temperature ($T_c \geq 15°$ K), high critical current density ($I_c > 10^5$ A/cm$^2$), high upper critical magnetic field ($H_{c2} > 300$ kG); in addition, the superconductor must keep its superconducting properties after bending (during the production of the coils); the superconductor must be inherently stable, i.e. the heat generated by the flux movements must be rapidly dissipated to the coolant as a result of its high thermal conductivity; sufficiently effective pinning centers must be available; the superconducting material should have a thermal conductivity almost equal to that of pure copper.

None of the materials so far used for the production of a superconducting coil has met these requirements, in particular because of insufficient ductility and limited mechanical strength. These difficulties are overcome by the material produced by the method covered by the invention. According to this method, the matrix material is continuously codeposited with the superconducting particles from the suspension electrolyte onto a passivated cathode and then peeled off. Cathodes to be used for this purpose should advantageously be rolls or belts made of a passivated alloy, e.g. stainless steel or titanium.

Said tape or foil produced by the method according to the invention can be coated in addition with pure matrix material by passing them through electrolytic bath, which may be of advantage in specific cases.

According to another embodiment of the invention, the superconductive material is continuously cut into narrow strips immediately after peeling off from the roll or the belt.

The deposition of superconducting tapes or foils which are later cut into narrower tapes from the suspension electrolyte by the method according to the invention can be effected in a relatively simple and economic manner and nevertheless leads to a superconducting material satisfying all demands made on a strip shaped high-field superconductor suitable for application in practice.

To produce the superconducting tapes or foils according to the present invention, the above-described niobium nitride particles were suspended in a sulfuric copper electrolyte, using a wetting agent (e.g. sodium dodecyl sulfonate). From this suspension, dispersion foils were deposited on a stainless-steel roll or a stainless-steel belt by electroplating. These foils detached readily from the stainless-steel substrate.

By appropriate selection of the deposition time the current density and the density of NbN particle kept in suspension in the electrolyte, it was possible to continuously produce and peel off primary foils up to about 25 μm in thickness. Repeated passage through the suspension electrolyte was also found to be advantageous. Heavy foils could subsequently be subjected to a rolling treatment to smooth the surface. Finally the resultant foils were coated on both sides with a pure copper layer a few microns in thickness; this serves as an effective insulation of the superconducting regions of adjacent windings without reducing the good thermal conductivity. In the last production step, the electrodeposited tapes were passed through a cutting device which cuts them into the desired widths. In most cases an additional insulation of the edges was not necessary; it is possible, however, to apply it subsequently in an electrolytic bath. The latter treatment may serve at the same time to coat the resultant tape with a low-melting-point metal or alloy which, after winding of the coil and an appropriate heat treatment, solders the various windings so that a firm mechanical bond is achieved.

The following list indicates the characteristics of a stripshaped high-current superconductor produced by the method described above:

Matrix: pure copper
Superconducting particles, NbN: diameter about 100 A
Cross section: 5000 μm x 30 μm
Tensile strength: 57 kg/mm
Elongation (in the tensile test): 7%
Transition temperature, $T_c = 17.2°$ K
Critical current density, $I_c = 5 \cdot 10^5$ A/cm$^2$
Upper critical magnetic field, $H_{c2} = 700$ kG
Inherent stability: perfect
Sensitivity to bending: none
Thermal conductivity: corresponding to that of copper, minus the volume content of incorporated NbN particles An electron-microscopic examination showed that the average distance between the NbN particles incorporated in the copper matrix was about 70 A.

According to the attached schematic drawing, the most important component of the device is an electrolytic cell 1, in which electrodeposition takes place. The anode of this cell is designated by 2. In this example the cathode is a belt 4 made of passivated material, from which the superconducting material deposited in the electrolytic cell 1 can be peeled off.

In the electrolytic cell 1 the endless belt 4 moves over a rotating deflection roller 3 in the direction of the arrows. Before entering the cell 1, belt 4 passes through a passivation bath 5 and a rinsing bath 6. The various deflection rollers for the band-shaped cathode 4 are marked 7 to 11.

The electrodeposited material in the form of a foil 12 of superconducting material is peeled off from belt 4 immediately after belt 4 has left the suspension electrolyte in cell 1 and wound on a storage roller 14 via the deflection roller 13. By means of a cutting device 15 it is possible to cut the foil into strips prior to winding it on roller 14.

A storage vessel 16 for the electrolyte is also shown in the drawing. Additional equipment is required for dispersing the superconducting particles, for keeping the temperature constant, and for circulating the suspension electrolyte; this equipment is not shown in the drawing because it is commercially available.

The passivation and rinsing baths 5 and 6 are to keep the band-shaped cathode 4 in passivated state to ensure that the electrodeposited superconducting foil can always be readily peeled off from the cathode 4.

We claim:

1. A method for the continuous production of ductile, superconducting material in the form of tapes, foils or wires comprising the steps of:

(a) preparing submicron particles of a superconducting material, said particles having diameters of between 50 and 2000 A;
(b) suspending said submicron particles in an electrolyte solution containing a wetting agent;
(c) codepositing said submicron superconducting particles and a matrix metal onto a moving substrate by galvanic action;
(d) alternately depositing at least one layer of matrix material having submicron particles dispersed therein and at least one layer of metal onto said deposit;
(e) reducing the cross-sectional dimensions of said deposit; and
(f) applying a coating thereto to isolate the superconducting layers.

2. The method of claim 1 wherein said moving substrate is a wire of the matrix material.

3. The method of claim 1 further comprising the step of drawing said deposit of submicron particles and matrix metal off said moving substrate after the step of codepositing said particles and said matrix metal.

4. The method of claim 3 wherein said deposit is drawn off in the form of a tape.

5. The method of claim 3 wherein said deposit is drawn off in the form of a foil.

6. The method of claim 1 comprising the additional steps of alternately depositing at least one layer of matrix material having submicron particles dispersed therein and at least one layer of metal onto said deposit after the step of reducing the cross-sectional dimensions of said deposit.

7. Method according to claim 1, wherein the moving substrate is a passivated cathode from which the superconducting deposited material is peeled off.

8. Method according to claim 1, wherein the deposition is effected onto a core of the matrix material, by several successive electroplating steps dispersion layers, i.e. metallic layers with incorporated superconducting particles, and metallic layers free from particles are alternately deposited.

9. Method according to claim 8, wherein the core comprises a wire which is continuously passed through electrolytic baths in which the dispersion layers and the particle-free layers are deposited, and wherein the cross-section of the wire is reduced by means of drawing dies between the individual electroplating steps.

10. Method according to claim 9, wherein intermediate annealing treatments at about 700° C are carried out after the individual drawing steps.

11. Method according to claim 3 wherein the dispersion layers are two to three times thicker than the particle-free layers.

12. Method according to claim 1 wherein the volume content of superconducting particles in the dispersion layers ranges between 5 and 50 volume percent.

13. Method according to claim 8, wherein in the coating or electroplating steps the diameter of the wire is increased by the deposited layers by a total of about 50 percent and that in the subsequent drawing steps with intermediate annealing treatments the wire diameter is reduced again to approximately the original dimension.

14. Method according to claim 13, wherein the wire is repeatedly passed through the electroplating steps with the subsequent drawing and intermediate annealing steps.

15. Method according to claim 8 wherein the superconducting particles incorporated in the dispersion layer have a mean distance below about 200 A.

16. Method according to claim 1 wherein sodium dodecyl sulfonate is added to the electrolyte as wetting agent.

17. Method according to claim 1 wherein monovalent heavy metal ions, such as Tl+ or the like, are added to the suspension electrolyte, said metal ions leading to an increase in the quantity of superconducting particles codeposited with the metalic matrix material.

18. Method according to claim 7, wherein after peeling off, the superconducting material is continuously cut into strips in the same operation.

19. Method according to claim 1, wherein the superconducting particles used consist of niobium nitride (NbN), niobium carbide (NbC), niobium carbonitride $(NbC_{1-x})Nx$ with $x > 0.5$) or of intermetallic compounds of niobium or vanadium with the elements aluminium, germanium, gallium, silicon or tin, which have an $\beta W/A15$ structure.

20. Method according to claim 1 wherein the matrix material is copper.

* * * * *